United States Patent [19]

Kock et al.

[11] 3,767,482

[45] Oct. 23, 1973

[54] METHOD OF MANUFACTURING A SEMICONDUCTOR DEVICE

[75] Inventors: Hendrikus Gerardus Kock; Dirk De Nobel; Rudolf Paulus Tijburg, all of Emmasingel, Eindhoven, Netherlands

[73] Assignee: U.S. Philips Corporation, New York, N.Y.

[22] Filed: Sept. 3, 1971

[21] Appl. No.: 177,642

[30] Foreign Application Priority Data

Sept. 8, 1970 Netherlands ........................ 7013227

[52] U.S. Cl. .................................. 148/177, 148/178

[51] Int. Cl. .............................................. H01l 7/46

[58] Field of Search ...................... 148/177, 178, 187

[56] References Cited

UNITED STATES PATENTS

| | | | |
|---|---|---|---|
| 3,088,856 | 5/1963 | Wannlund | 148/177 |
| 2,801,348 | 7/1957 | Pankove | 148/177 |
| 3,533,856 | 10/1970 | Panish | 148/177 |
| 3,070,466 | 12/1962 | Lyons | 148/177 |
| 2,801,375 | 7/1957 | Losco | 148/177 |
| 3,184,823 | 5/1965 | Little | 148/177 |
| 3,211,594 | 10/1965 | Andres | 148/178 |
| 3,243,325 | 3/1966 | Shinoda | 148/178 |

*Primary Examiner*—Hyland Bizot
*Attorney*—Frank R. Trifari

[57] ABSTRACT

The invention relates to the provision of low-resistance ohmic contacts on $A^{III}B^{V}$ semiconductor bodies. The known alloying contacts provided by means of a doping layer show a poor thermal conductivity, present difficulties in providing current conductors, and can often be used only at low temperatures. According to the invention, the doping layer is removed after alloying and replaced by a contact layer which consists of metals. With such a contact layer, for example, Gunn effect microwave semiconductor devices can by manufactured having a high energy efficiency.

9 Claims, 4 Drawing Figures

INVENTORS
HENDRIKUS G. KOCK
DIRK DE NOBEL
RUDOLF P. TIJBURG
BY
Frank R. Trifari
AGENT

METHOD OF MANUFACTURING A SEMICONDUCTOR DEVICE

The invention relates to a method of manufacturing a semiconductor device in which a low resistance ohmic contact is provided on a part of a semiconductor body which mainly consists of an $A^{III}B^{V}$ compound or a mixed crystal thereof of the one conductivity type by providing on a surface of the semiconductor body a doping layer comprising a metal and a doping material which causes the one conductivity type in the semiconductor body and by heating the body and the layer at a temperature at which the doping layer and the semiconductor body alloy, the assembly being then cooled and doped semiconductor material being deposited on the semiconductor body. The invention furthermore relates to a semiconductor device manufactured by means of this method.

Semiconductor devices which are manufactured by means of the method are, for example, avalanche diodes and varactor diodes, Schottky diodes, light-emissive diodes and Gunn effect microwave devices.

The method is known, for example, from an article in "Solid State Electronics," Vol. 10, pp. 381–383 (1967). This article describes that providing an ohmic $n^+$ contact on an $n$-type gallium arsenide body by providing a doping layer containing gold and germanium on the gallium arsenide body and alloying it with said body.

After such an alloying process, a hard and brittle layer is present on the semiconductor body which often goes hand in hand with a eutectic composition of said layer. It has proved very difficult and often impossible to provide a current conductor on the brittle layer by means of thermo-compression bonding conventionally used in semiconductor technology.

Another frequently used doping layer contains silver and tin. In order to obtain a good wetting of the semiconductor body during alloying, layers having a comparatively high tin content must be used so that owing to the low melting point of tin, only low operating temperatures of the semiconductor devices can be used.

It is to be noted in addition that the eutectic layers formed during the alloying process have, in addition to poor mechanical properties, also often a poor thermal conductivity as a result of which they insufficiently dissipate the thermal energy evolved in the device.

One of the objects of the invention is to avoid the drawbacks of the known devices at least for the greater part. The invention is based on the recognition of the fact that, in order to obtain a good thermo-compression bonding and a good thermal conductivity, replacement of the doping layer is desirable.

Therefore, the method mentioned in the preamble is characterized according to the invention in that, after cooling, the doping layer is removed and a metallic contact layer is provided on the doped semiconductor material.

Contact layers which readily conduct the thermal energy and on which current conductors can be provided particularly readily by means of thermocompression methods, are obtained on $A^{III}B^{V}$ semiconductor bodies by means of the method according to the invention. As a result of the good quality of the contacts, namely a good conductivity of thermal energy and electricity, the ultimately obtained devices can also be used at high temperatures while the energy efficiency, i.e., the ratio of the energy of the signal produced in the semiconductor device to the energy supplied to the device is considerably better than that of the known semiconductor devices.

Gallium arsenide or gallium phosphide is preferably used as an $A^{III}B^{V}$ compound.

Low resistance ohmic contacts are of particular importance on $n$-type $A^{III}B^{V}$ semiconductor bodies and are obtained, for example, by using doping layers which comprise gold and germanium or silver and tin. Low resistance ohmic contacts on $p$-type $A^{III}B^{V}$ semiconductor bodies are obtained, for example, by using doping layers of gold and zinc or silver and platinum or gallium and silicon. If a doping layer comprising gallium and silicon is used on, for example, gallium phosphide, phosphorus atoms are replaced by silicon atoms.

Since the doping layer is removed after alloying, the composition of said layer may be chosen to be so that the semiconductor material which is deposited upon cooling is optimally doped.

Therefore a doping layer is preferably used having a gold content between 80 percent by weight and 88 percent by weight, while the remainder consists substantially of germanium, or a doping layer is used having a silver content between 40 percent by weight and 70 percent by weight, the remainder consisting substantially of tin.

In order to obtain doped semiconductor material after alloying, cooling is preferably carried out slowly and during cooling the semiconductor body has a lower temperature than the adjoining alloy of the semiconductor material and the doping layer.

It is particularly difficult to provide a good ohmic contact on a substrate having a high resistivity. However, the method according to the invention may also advantageously be applied to low-ohmic substrates.

If desirable, an ohmic contact may also be provided simultaneously on two sides of an $A^{III}B^{V}$ semiconductor body. If in this case a high-ohmic and a low-ohmic part of the semiconductor body are to be contacted, this is done in such manner that at least the temperature of the high-ohmic part is lower than that of the alloy adjoining said part.

The removal of the doping layer may take place, for example, by dissolving in a suitable solvent which does not attack or pollute the semiconductor body. It has been found to be sufficient to use a solvent which dissolves the metal of the doping layer.

Therefore a doping layer is preferably used which is removed after cooling by dissolving in mercury or in liquid gallium.

The metallic contact layer may be provided in a usual manner, for example, by vapour-deposition.

The choice of the composition of the contact layer is wider than in the known methods in which the doping layer not only serves for alloying but on which current conductors have also to be provided. The contact layer may consist of the same material which is also present in the doping layer. A contact layer is preferably used which consists of at least two metal layers in which, for example, first a readily adhering metal layer is used which is then covered with another metal layer, which may be of importance for obtaining a ready assembling.

Therefore, a first metal layer is preferably used which contains at least one of the elements chromium, aluminium and titanium on which layer a second metal layer is provided which consists of gold or silver.

A further advantage of the method according to the invention is that semiconductor devices can be obtained in which migration of metals which occur in contacts are avoided considerably along the surface.

Therefore, in an important embodiment of the method according to the invention, another part of the surface of the semiconductor body on the same side of the semiconductor body as the said doping layer is provided with a second doping layer, the doping layers are then alloyed with the semiconductor body, cooling being then carried out in which separated regions of doped semiconductor material are formed, the doping layers being then removed and each doped region being partly provided with a metallic contact layer, the metallic contact layers being provided at a larger distance from each other than the preceding doping layers.

By means of the embodiment, for example, a semiconductor device is obtained, in which at the surface of the semiconductor body microwaves are generated at high voltage between the contact layers without migration of metals along the surface and short-circuit substantially occurring.

The doping layers are provided, for example, by vapour deposition via a mask having apertures of suitable dimensions, or by photoetching of a vapourdeposited doping layer.

The invention furthermore relates to a semiconductor device manufactured by means of the method according to the invention.

In order that the invention may be readily carried into effect, two embodiments thereof will now be described in detail, by way of example, with reference to the accompanying drawing, in which.

EXAMPLE I.

Figure 1:
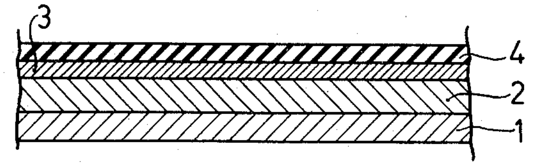
FIGS. 1 to 3 are sectional views of a part of a semiconductor device in successive stages of manufacture by means of the method according to the invention.

In this embodiment of the method according to the invention starting material is a semiconductor body consisting of a disc 1 of gallium arsenide of the $n^+$ conductivity type (see FIG. 1), on which an epitaxial gallium arsenide layer 2 of the n-conductivity type is provided in the usual manner. The resistivity of the disc 1 is 0.001 ohm. cm and that of the layer 2 is 0.3 ohm. cm. The thickness of the disc is 30 $\mu$ and the thickness of the epitaxial layer is 20 $\mu$.

Vapour-deposited in a high vacuum apparatus on the surface on the epitaxial layer 2 are then successively 500 A silver, 3,500 A tin and 4,00 A silver. These deposited layers are denoted in FIG. 1 as one doping layer 3, in which silver is the metal and tin is the doping material which causes the $n^+$ conductivity type in the gallium arsenide semiconductor body. The layer 3 is then provided in the usual manner with a 0.25 $\mu$ thick layer 4 of pyrolytic silicon oxide at approximately 400° C. At this temperature the tin-silver mixture has not melted since the tin takes up a quantity of silver, as a result of which the melting point is raised while no reaction with the gallium arsenide or bulging of the doping layer 3 occur.

The silicon oxide layer 4 forms a screening as a result of which evaporation of arsenic, if any, can be avoided and the flatness of the ultimate contact can be furthered.

The semiconductor body and the doping layer are then heated at a temperature at which the body and the layer alloy.

Alloying takes place in a furnace which comprises an external heating device which maintains the temperature of the furnace at approximately 200° C, while the temperature is brought at approximately 500° C by means of an internal heating device. The semiconductor body, for heating, is placed in the furnace so that the silicon oxide layer 4 is in direct contact with the internal heating device.

The temperature is maintained at approximately 500° C for approximately 2.5 minutes, the epitaxial layer 2 and the doping layer 3 alloying, after which there is cooled slowly at a rate of 180° C per hour, doped semiconductor material being deposited on the semiconductor body. The whole alloying process is carried out in an atmosphere of very pure hydrogen.

During cooling, the temperature distribution in the furnace is adjusted so that at least the temperature of the epitaxial layer is lower than that of the adjoining alloy of the semiconductor material and the doping layer. As a result of this, recrystallisation of the gallium arsenide at the surface of the comparatively high-ohmic layer 2 is promoted.

After cooling, the silicon oxide layer 4 is removed in the usual manner and the doping layer 3 is removed by means of mercury or melted gallium which do not attack or pollute the doped gallium arsenide.

The thickness of the recrystallized layer is approximately 1,000A.

Figure 2:
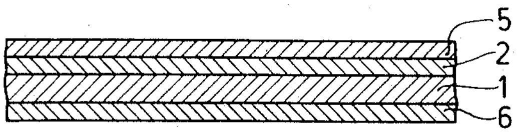

A metallic contact layer 5 is provided by vapour-deposition on the doped semiconductor material (see FIG. 2), which contact layer consists of two metal layers, namely a first metal layer of titanium and a second metal layer of gold, which layers are not shown separately in FIG. 2.

The contact resistance measured in the usual manner is $10^{-4}$ ohm.cm$^2$.

At the same time and in the same manner as described above, i,e., by means of a doping layer, the disc 1 may be provided with a metallic contact layer 6. During cooling of the doping layer on the disc, the temperature gradient is not optimum. It is true, but the provision of an ohmic contact with low contact resistance on the disc is a less critical process than on the epitaxial layer, since said layer has a considerably higher resistivity than the disc.

Figure 3:
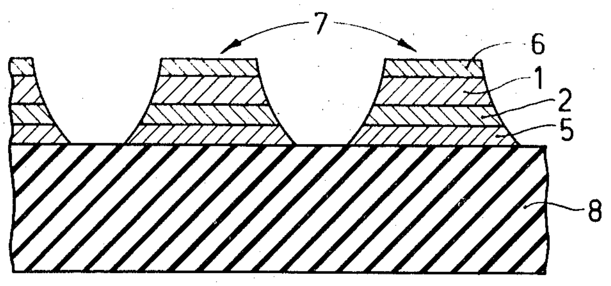

In a usual manner, the disc 1 can be mounted, via the layer 6, on a rigid substrate of, for example, glass, after which mesas 7 having a diameter of 160–190 $\mu$ can be formed by means of photoetching treatment (see FIG. 3) and the substrate 8 be removed. The individual mesas can be assembled in a suitable holder by means of the thermocompression process and may then be used as Gunn effect devices.

In the method according to the invention the doped semiconductor material is very low-ohmic, as a result of which a good contact can be obtained by vapour deposition of a metallic contact layer without subsequent alloying.

A Gunn effect device provided with an ohmic contact by means of the method according to the invention supplied a 5 GHz signal with an energy of 500 mW and an energy efficiency of 5 percent when applying a non-pulsatory direct voltage.

EXAMPLE II.

Figure 4:
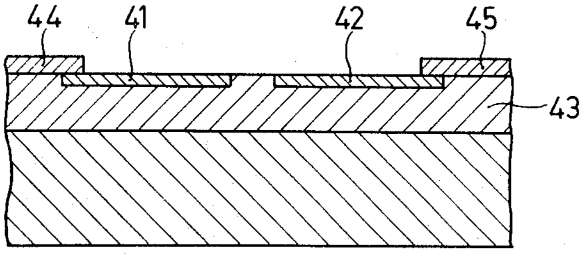
FIG. 4 is a sectional view of a part of another semiconductor device in a stage of manufacture by means of the method according to the invention.

In an important embodiment of the method according to the invention, another part of the surface of the semiconductor body on the same side of the semiconductor body as the doping layer was provided with a second doping layer. The doping layers were then alloyed with the semiconductor body after which cooling was carried out, separated regions 41 and 42 (see FIG. 4) of doped semiconductor material being formed in an epitaxial layer 43. The doping layers were then removed after which the doped regions 41 and 42 were partly provided with metallic contact layers 44 and 45, said contact layers being arranged at a larger distance from each other than the preceding doping layers.

With a distance of 100 $\mu$ between the contact layers 44 and 45 and a distance of 20 $\mu$ between the doped regions 41 and 42 (corresponding to the distance between the preceding doping layers) migration of metals from the contact layers for example, of silver, is avoided.

The invention is not restricted to the above-described examples. In addition to Gunn effect devices for example light-emissive diodes may be manufactured. In addition to gallium arsenide are to be considered gallium phosphide and mixed crystals of the two compounds.

Se may be added, for example, to a doping layer of tin and silver. Se causes the n-conductivity type in $A^{III}B^{V}$ compounds, an improves the wetting of the semiconductor body through the silver-tin doping layer.

What is claimed is:

1. A method of manufacturing a semiconductor device comprising a low-resistance ohmic connection, comprising the steps of:

a. providing a semiconductor body having a surface portion of a material selected from the group consisting essentially of an $A^{III}B^{V}$ compound and a mixed crystal thereof, said surface portion having a given conductivity type;

b. providing on the surface of said surface portion at least one doping layer comprising a metal and a doping impurity material capable of imparting said given conductivity type to said surface portion;

c. heating said surface portion and said doping layer to form an alloy of said doping layer and a surface region of said surface;

d. cooling the assembly to deposit from said alloy on said surface portion semiconductor material further doped with said impurity material and to deposit on said doped semiconductor material a residual portion of said doping layer;

e. removing entirely the residual portion of said doping layer; and then f. providing a metallic contact at at least a portion of said deposited semiconductor material.

2. A method as recited in claim 1, wherein said $A^{III}B^{V}$ compound is one of gallium arsenide and gallium phosphide.

3. A method as recited in claim 1, wherein said doping layer is about 80 percent to about 88 percent by weight gold and the balance consists essentially of germanium.

4. A method as recited in claim 1, wherein said doping layer is about 40 percent to about 70 percent by weight silver and the balance consists essentially of tin.

5. A method as recited in claim 1, wherein said cooling is carried out at a low rate and such that during cooling said surface portion has a lower temperature than the adjoining said alloy thereof.

6. A method as recited in claim 1, wherein said doping layer is removed by dissolving in one of mercury and liquid gallium.

7. A method as recited in claim 1, wherein said metallic contact consists of at least two different metal layers.

8. A method as recited in claim 7, wherein a first one of said metal layers contains at least one of the elements chromium, aluminum and titanium and a second one of said metal layers is disposed on said first layer and consists essentially of gold or silver.

9. A method as recited in claim 1, further comprising the step of providing a second said doping layer on a second part of said surface, heating said surface portion and second doping layer to form a second said alloy region at said surface, cooling said surface portion and said second layer whereby there is deposited on said surface portion semiconductor material further doped with said impurity material, removing the residual portion of said second doping layer, and then providing a metallic contact at at least a portion of said deposited semiconductor material.

* * * * *